US012733364B2

(12) United States Patent
Kim et al.

(10) Patent No.: US 12,733,364 B2
(45) Date of Patent: Sep. 8, 2026

(54) LIGHT EMITTING DISPLAY DEVICE

(71) Applicant: LG DISPLAY CO., LTD., Seoul (KR)

(72) Inventors: KangIl Kim, Paju-si (KR); Seongku Lee, Paju-si (KR); Kihyung Lee, Paju-si (KR); Seongkwang Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 509 days.

(21) Appl. No.: 18/369,223

(22) Filed: Sep. 18, 2023

(65) Prior Publication Data

US 2024/0188362 A1 Jun. 6, 2024

(30) Foreign Application Priority Data

Dec. 5, 2022 (KR) ........................ 10-2022-0167755

(51) Int. Cl.

*H10K 59/131* (2023.01)
*H10K 59/88* (2023.01)
*H10K 71/00* (2023.01)
*H10K 102/00* (2023.01)

(52) U.S. Cl.

CPC ......... *H10K 59/1315* (2023.02); *H10K 59/88* (2023.02); *H10K 71/861* (2023.02); *H10K 2102/3026* (2023.02)

(58) Field of Classification Search

CPC .. H10K 59/1315; H10K 59/88; H10K 71/861; H10K 2102/3026; H10K 59/122; H10K 59/131; H10K 59/1213; H10K 59/123; H10K 59/124; H10K 59/8051; H10K 59/80521

See application file for complete search history.

(56) References Cited

U.S. PATENT DOCUMENTS

| | | | | |
|---|---|---|---|---|
| 2021/0336088 A1* | 10/2021 | Park | .................. | H10H 20/8316 |
| 2022/0209187 A1* | 6/2022 | Bok | .................. | H10K 59/124 |
| 2023/0189572 A1* | 6/2023 | Lee | .................. | H10K 59/1315 257/40 |
| 2024/0057411 A1* | 2/2024 | An | .................. | H10K 59/131 |

FOREIGN PATENT DOCUMENTS

KR 2017-0081074 A 7/2017

* cited by examiner

*Primary Examiner* — Thanh T Nguyen
(74) *Attorney, Agent, or Firm* — PnK IP LLC

(57) ABSTRACT

A light emitting display device includes a common power line and a driving power line disposed parallel each other on a substrate; a first pixel disposed between the common power line and the driving power line, and including a left side, a right side, an upper side and a lower side; a first connection part disposed at a first crossing area where the left side and the upper side intersect; a first dummy area disposed at a second crossing area where the right side and the lower side intersect; and a common electrode over the entire substrate as being one layer. The common power line connects to the common electrode at the first connection part. The driving power line passes the first dummy area.

15 Claims, 9 Drawing Sheets

FIG. 2

LIGHT EMITTING DISPLAY DEVICE

CROSS-REFERENCE TO RELATED APPLICATION

This application claims the priority of Korean Patent Application No. 10-2022-0167755 filed on Dec. 5, 2022 which are hereby incorporated by reference in its entirety.

BACKGROUND

Field of the Disclosure

The present disclosure relates to a light emitting display device.

Description of the Background

Among display devices, a top emission type light emitting display device has a high aperture ratio and may provide excellent display quality with high luminance versus power consumption. For the top emission type light emitting display device, the common electrode is formed of a transparent conductive material. Accordingly, for a large area top emission type display device, sheet resistance of a common electrode should be lowered so that a luminance difference does not occur over the entire area.

To lower the sheet resistance of the common electrode, a structure in which an auxiliary line is formed of a metal material having low electrical resistance and the common electrode is required to be electrically connected to the auxiliary line. In this case, structural improvement is required to minimize the area for the connection portion between the auxiliary line and the common electrode in comparison to the entire area of the display panel, while maintaining low connection resistance.

SUMMARY

Accordingly, the present disclosure is directed to a light emitting display device that substantially obviates one or more of problems due to limitations and disadvantages described above.

More specifically, the present disclosure is to provide a top emission type light emitting display device that realizes high luminance with low power consumption due to high luminance compared to power used.

The present disclosure is also to provide a top emission type light emitting display device having an auxiliary line for lowering sheet resistance of a common electrode constituting a light emitting diode.

In addition, the present disclosure is provide a top emission type light emitting display device capable of maintaining a low contact resistance in the connection part while minimizing the area for a connection part connecting a common electrode and an auxiliary line in comparison to the entire area of the display panel.

Further, the present disclosure is to provide a low power top emission display device capable of maximally ensuring an aperture ratio while lowering resistance of a common electrode by optimizing an area ratio occupied by a connection unit connecting a common electrode and an auxiliary line in the entire area of a display panel.

To achieve these and other advantages and in accordance with the present disclosure, as embodied and broadly described, a light emitting display device includes a common power line and a driving power line disposed parallel each other on a substrate; a first pixel disposed between the common power line and the driving power line, and including a left side, a right side, an upper side and a lower side; a first connection part disposed at a first crossing area where the left side and the upper side intersect; a first dummy area disposed at a second crossing area where the right side and the lower side intersect; and a common electrode over the entire substrate as being one layer. The common power line connects to the common electrode at the first connection part. The driving power line passes the first dummy area.

In one aspect, the light emitting display device further comprises: a first repair part disposed at a third crossing area where the left side and the lower side intersect, and the common power line passes the first repair part; and a second repair part disposed at a fourth crossing area where the right side and the upper side intersect, and the driving power line passes the second repair part.

In one aspect, the first repair part includes: an open area disposed at a central portion of the common power line; a buffer layer on the common power line; a scan line passing the open area on the buffer layer; a passivation layer on the scan line; a planarization layer on the passivation layer; and a bank on the planarization layer.

In one aspect, the second repair part includes: an open area disposed at a central portion of the driving power line; a buffer layer on the driving power line; a scan line passing the open area on the buffer layer; a passivation layer on the scan line; a planarization layer on the passivation layer; and a bank on the planarization layer.

In one aspect, the light emitting display device further comprises: a second pixel adjacent to the left side of the first pixel with the common power line interposed there-between; a third repair part disposed at a fifth crossing area where a left side of the second pixel and an upper side of the second pixel intersect; and a second dummy area disposed at a sixth crossing area where the left side of the second pixel and a lower side of the second pixel.

In one aspect, the light emitting display device further comprises: a second pixel adjacent to the right side of the first pixel with the driving power line interposed there-between; a second connection part disposed at a seventh crossing area where a right side of the second pixel and an upper side of the second pixel intersect; and a third repair part disposed at an eighth crossing area where the right side of the second pixel and a lower side of the second pixel.

In one aspect, the first pixel includes at least three sub pixels. One sub pixel includes: a driving element disposed at each sub pixels; a driving electrode connected to the driving element; an emission layer on the driving electrode; and a common electrode on the emission layer.

In one aspect, the first connection part includes: a common power line on the substrate; a buffer layer on the common power line; an auxiliary electrode connected to the common power line and disposed on the buffer layer at the first crossing area; a passivation layer on the auxiliary electrode; a circular trench exposing some of the auxiliary electrode and disposed at the passivation layer; a planarization layer on the passivation layer for exposing the trench; a bank on the planarization layer for exposing the trench; and an undercut area removing some of the planarization layer under the bank. The emission layer is disposed on the bank and the planarization layer except the undercut area. The common electrode connects to the auxiliary electrode exposed at the undercut area.

In one aspect, the driving power line is disposed at the right side. At the second crossing area, the buffer layer covering the driving power line, the passivation layer, the planarization layer, the bank, the emission layer and the common electrode are sequentially disposed.

In another aspect of the present disclosure, a light emitting display device includes a first pixel at a first row and a first column of a 2×2 matrix unit on a substrate; a second pixel at the first row and a second column; a third pixel at a second row and the first column; a fourth pixel a the second row and the second column; a common electrode deposited as one layer covering entire substrate including the first pixel, the second pixel, the third pixel and the fourth pixel; a first common power line at a left side of the first pixel and the third pixel; a second common power line disposed at a right side of the second pixel and the fourth pixel; connection parts disposed at a left upper corner of the first pixel, at a right upper corner of the second pixel, at a left lower corner of the third pixel and at a right lower corner of the fourth pixel; and a dummy area disposed at crossing area where the first to fourth pixels are commonly intersect. The common electrode connects the first common power line and the second common power line at the connection parts.

In one aspect, the light emitting display device further comprises: a driving power line disposed between the first pixel and the second pixel, and between the third pixel and the fourth pixel.

In one aspect, the light emitting display device further comprises: repair parts disposed at a right upper corner of the first pixel, at a right lower corner of the second pixel, at a left upper corner of the third pixel, and at a left lower corner of the fourth pixel.

In one aspect, the light emitting display device further comprises: auxiliary electrodes disposed at the connection parts and connected to the first common power line and the second common power line. The auxiliary electrodes are connected to the common electrode.

In one aspect, the light emitting display device further comprises: a first scan line at a lower side of the first pixel and the second pixel; a first auxiliary scan line disposed at a first predetermined distance from the first scan line; a first connecting scan line disposed at the repair parts and connecting the first scan line to the first auxiliary scan line; a second scan line at a lower side of the third pixel and the fourth pixel; a second auxiliary scan line disposed at a second predetermined distance from the second scan line; and a second connecting scan line disposed at the repair parts and connecting the second scan line to the second auxiliary scan line.

In one aspect, each of the first to fourth pixels includes at least three sub pixels. each of the sub pixels includes: a driving element; a driving electrode connected to the driving element; and an emission layer on the driving electrode. The common electrode is disposed on the emission layer.

The light emitting display device according to the present disclosure may be a top emission type light emitting display device having high luminance compared to power consumption.

A top emission type display device according to the present disclosure minimizes and optimizes an area ratio occupied by all connection portions for connecting a common electrode to auxiliary lines in the entire area of the display panel, thereby reducing resistance of the common electrode and minimizing an aperture ratio. Accordingly, it may be operated with low power consumption.

In addition to the effects of the present disclosure mentioned above, other features and advantages of the present disclosure are described below, or may be clearly understood by those skilled persons in the art from such description and explanation.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings:

FIG. 2 is an enlarged plan view illustrating a structure in which four pixels are arranged in a light emitting display device according to a first aspect of the present disclosure;

DETAILED DESCRIPTION

Figure 1:
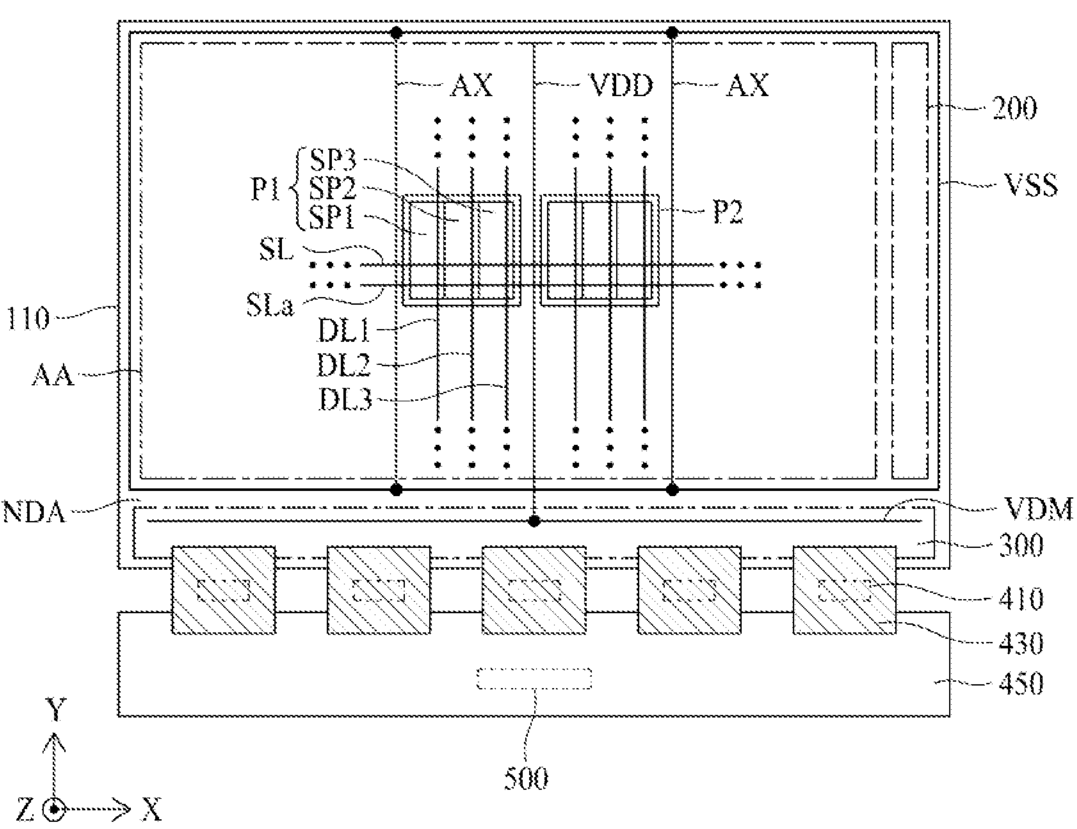
FIG. 1 is a plan view illustrating a schematic structure of a light emitting display device according to an example of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these example aspects are provided so that this disclosure may be sufficiently thorough and complete to assist those skilled in the art to fully understand the scope of the present disclosure. Further, the protected scope of the present disclosure is defined by claims and their equivalents.

Reference will now be made in detail to the exemplary aspects of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

The shapes, sizes, ratios, angles, numbers, and the like, which are illustrated in the drawings to describe various example aspects of the present disclosure, are merely given by way of example. Therefore, the present disclosure is not limited to the illustrated details. Like reference numerals refer to like elements throughout the specification unless otherwise specified. In the following description, where the detailed description of the relevant known function or configuration may unnecessarily obscure an important point of the present disclosure, a detailed description of such known function of configuration may be omitted.

In the present specification, where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is construed as including an error or tolerance range even where no explicit description of such an error or tolerance range is provided.

In the description of the various aspects of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween. Also, if a first element is described as positioned "on" a second element, it does not necessarily mean that the first element is positioned above the second element in the figure. The upper part and the lower part of an object concerned may be changed depending on the orientation of the object. Consequently, where a first element is described as positioned "on" a second element, the first element may be positioned "below" the second element or "above" the second element in the figure or in an actual configuration, depending on the orientation of the object.

In describing a temporal relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

In describing the components of this specification, terms such as 'first', 'second', 'A', 'B', '(a)', and '(b)' may be used. These terms are only used to distinguish the component from other components, and the nature, sequence, order or number of the corresponding component is not limited by these terms. Where an element is described as being "linked", "coupled," or "connected" to another element, that element may be directly or indirectly connected to that other element unless otherwise specified. It is to be understood that additional element or elements may be "interposed" between the two elements that are described as "linked," "connected," or "coupled" to each other.

It should be understood that the term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Features of various aspects of the present disclosure may be partially or overall coupled to or combined with each other, and may be variously inter-operated with each other and driven technically as those skilled in the art may sufficiently understand. The aspects of the present disclosure may be carried out independently from each other, or may be carried out together in a co-dependent relationship.

Hereinafter, an example of a display apparatus according to the present disclosure will be described in detail with reference to the attached drawings. Wherever possible, the same reference numbers will be used throughout the drawings to refer to the same or like parts. Since a scale of each of elements shown in the accompanying drawings may be different from an actual scale for convenience of description, the present disclosure is not limited to the scale shown in the drawings.

Hereinafter, referring to the attached figures, a light emitting display device according to the present disclosure will be explained. In adding reference numerals to elements of each drawing, the same elements may have the same numerals as much as possible even if they are displayed on different drawings.

FIG. 1 is a plan view illustrating a schematic structure of a light emitting display device according to an example of the present disclosure. In FIG. 1, X-axis refers to the direction parallel to the scan line, Y-axis refers to the direction of the data line, and Z-axis refers to the height direction of the display device.

Referring to FIG. 1, a light emitting display device comprises a substrate 110, a gate (or scan) driver 200, a pad portion 300, a source driving IC (Integrated Circuit) 410, a flexible film 430, a circuit board 450, and a timing controller 500.

The substrate 110 may include an electrical insulating material or a flexible material. The substrate 110 may be made of a glass, a metal or a plastic, but it is not limited thereto. When the light emitting display device is a flexible display, the substrate 110 may be made of the flexible material such as plastic. For example, the substrate 110 may include a transparent polyimide material.

The substrate 110 may include a display area AA and a non-display area NDA. The display area AA, which is an area for representing the video images, may be defined as the majority middle area of the substrate 110, but it is not limited thereto. In the display area AA, a plurality of scan lines SL (or gate lines), a plurality of auxiliary scan lines SLa, a plurality of data lines DL1, DL2 and DL3, and a plurality of pixels P1 and P2 may be formed or disposed. Each of pixels P1 and P2 may include a plurality of sub pixels SP1, SP2 and SP3. Each of sub pixels SP1, SP2 and SP3 includes any one of data lines DL1, DL2 and DL3, the scan line and the auxiliary scan line SLa, respectively.

For example, two pixels P1 and P2 are adjacently disposed side by side along X-axis. Each pixel may include three sub-pixels SP1, SP2 and SP3. The pixels P1 and P2 may include a first scan line SL1 and a first auxiliary scan line SL1*a*. The first scan line SL1 and the first auxiliary scan line SL1*a* receive the same scan signal and may be connected to each other. The reason why the first auxiliary scan line SL1*a* is provided is to transmit the scan signal normally even though the first scan line SL1 is damaged by using the first auxiliary scan line SL1*a* for sending the scan signal.

Each of the sub-pixels SP1, SP2 and SP3 may include one data line. The first data line DL1 may be provided to the first sub-pixel SP1, the second data line DL2 may be provided to the second sub-pixel SP2 and the third data line DL3 may be provided to the third sub-pixel SP3.

A driving power line VDD may be disposed between two neighboring pixels P1 and P2. In addition, a common power line AX may be disposed on the left side of the first pixel P1 and the right side of the second pixel P2, respectively.

The driving power line VDD may be connected to a high-potential line VDM disposed in the non-display area NDA. The common power line AX may be disposed in the non-display area NDA and may be connected to the low potential line VSS surrounding the display area AA.

The non-display area NDA, which is an area not representing the video images, may be defined at the circumference areas of the substrate 110 surrounding all or some of the display area DA. In the non-display area NDA, the gate driver 200 and the pad portion 300 may be formed or disposed.

The gate driver 200 may supply the scan (or gate) signals to the first scan line SL1 and the first auxiliary scan line SL1*a* according to the gate control signal received from the timing controller 500 via the pad portion 300. The gate driver 200 may be formed at the non-display area NDA at any one outside of the display area AA on the substrate 110, as a GIP (Gate driver In Panel) type. GIP type means that the gate driver 200 is directly formed on the substrate 110. For example, the gate driver 200 may include a shift register. The GIP type refers to a structure in which transistors configuring the shift register of the gate driver 200 are directly formed on the substrate 110.

The pad portion 300 may be disposed in the non-display area NDA at one edge of the display area AA of the substrate 110. The pad portion 300 may include data pads connected to each of the data lines, driving current pads connected to the driving current lines, a high-potential pad receiving a high-potential voltage and a low-potential pad receiving a low-potential voltage.

The source driving IC 410 may receive the digital video data and the source control signal from the timing controller 500. The source driving IC 410 may convert the digital video data into the analog data voltages according to the source control signal and then supply that to the data lines. When the source driving IC 410 is made as a chip type, it may be installed on the flexible circuit film 430 as a chip on film (COF) or chip on plastic (COP) type.

The flexible circuit film 430 may include a plurality of first link lines connecting the pad portion 300 to the source driving IC 410, and a plurality of second link lines connecting the pad portion 300 to the circuit board 450. The flexible film 430 may be attached on the pad portion 300 using an anisotropic conducting film, so that the pad portion 300 may be connected to the first link lines of the flexible film 430.

The circuit board 450 may be attached to the flexible circuit film 430. The circuit board 450 may include a plurality of circuits implemented as the driving chips. For example, the circuit board 450 may be a printed circuit board or a flexible printed circuit board.

The timing controller 500 may receive the digital video data and the timing signal from an external system board through the line cables of the circuit board 450. The timing controller 500 may generate a gate control signal for controlling the operation timing of the gate driver 200 and a source control signal for controlling the source driving IC 410, based on the timing signal. The timing controller 500 may supply the gate control signal to the gate driver 200 and supply the source control signal to the source driving IC 410. Depending on the product types, the timing controller 500 may be formed as one chip with the source driving IC 410 and mounted on the substrate 110 to be connected to pad portion 300.

Figure 2:
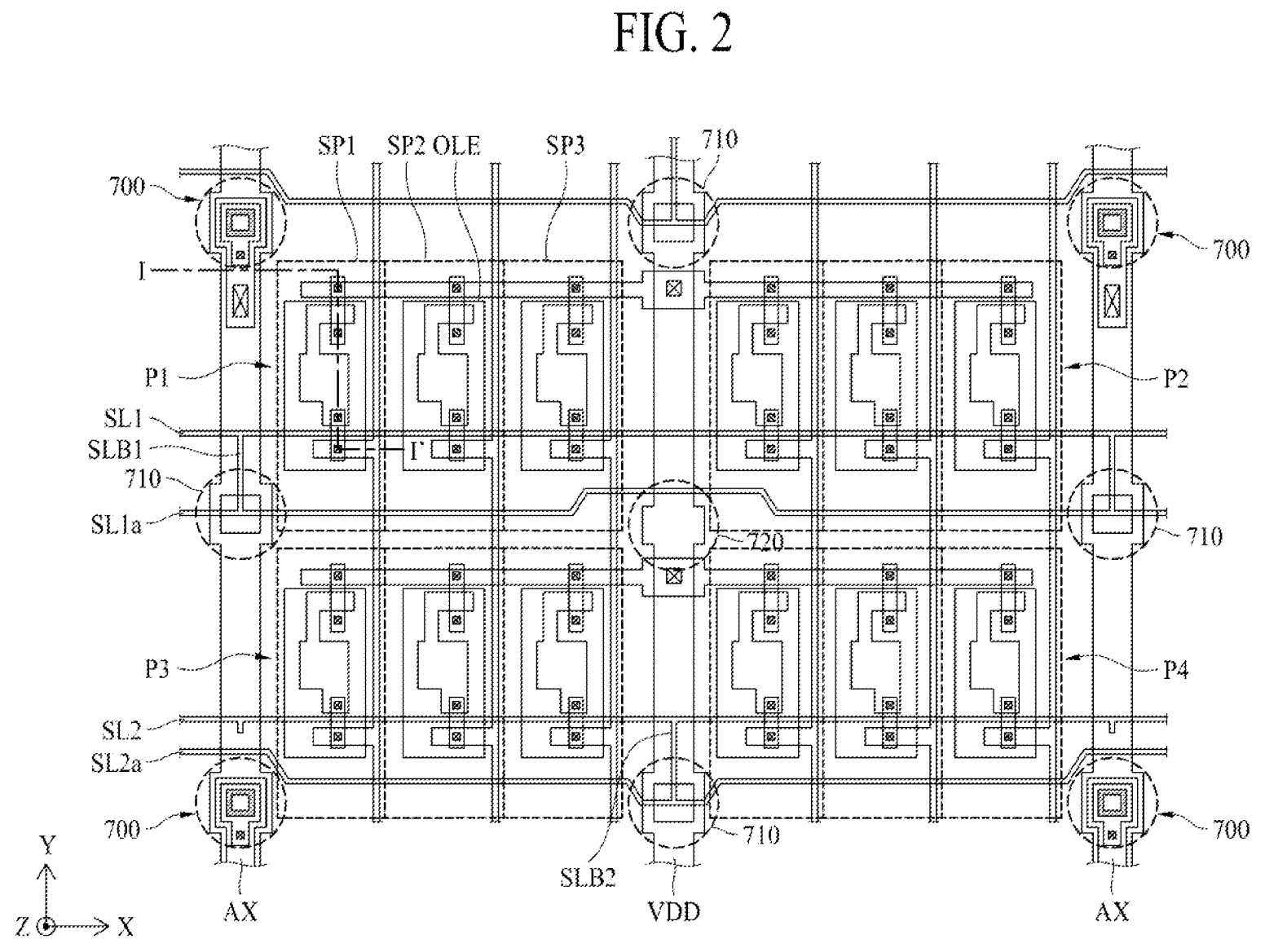
Figure 3:
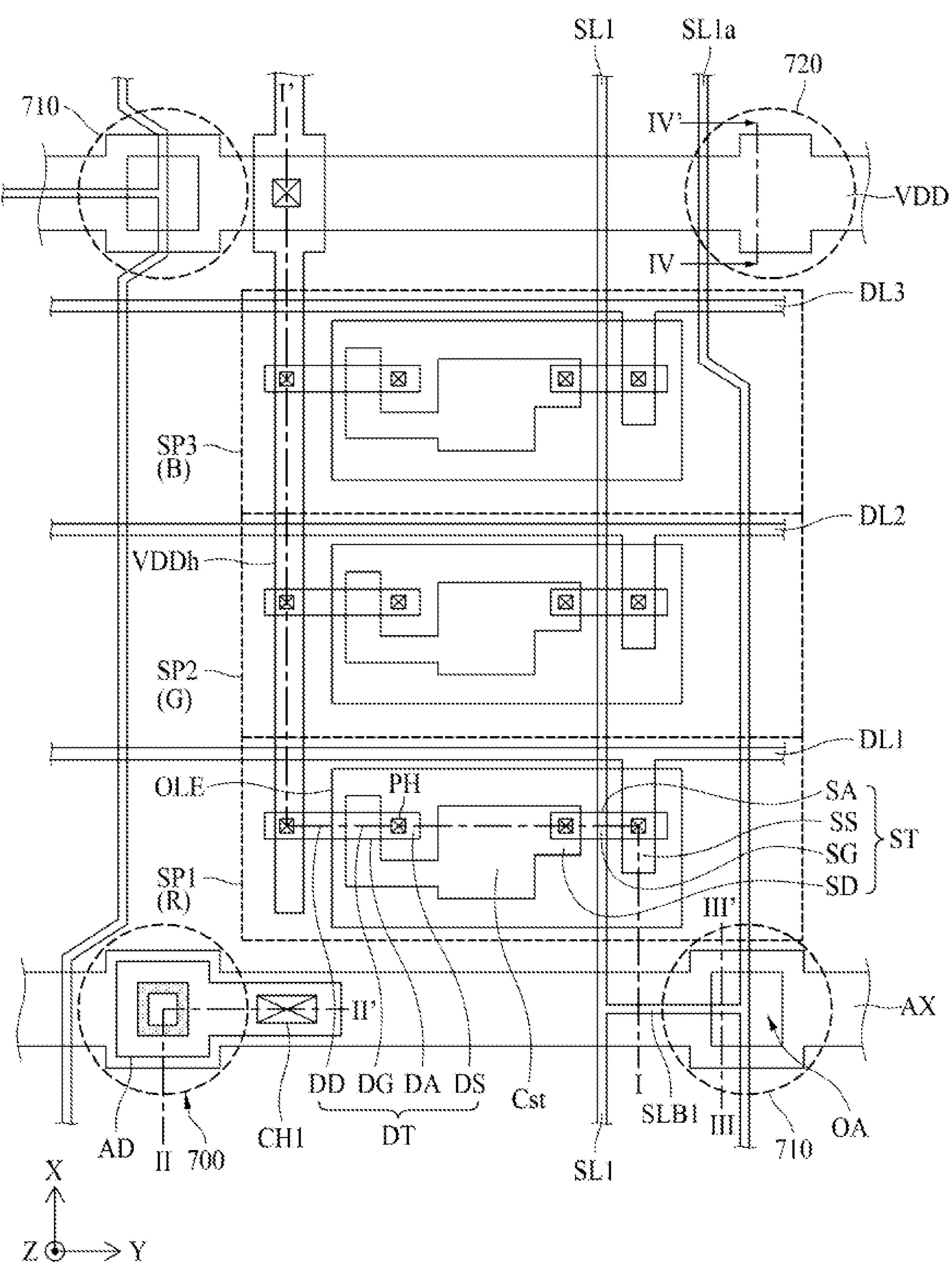
FIG. 3 is an enlarged plan view illustrating a structure of one pixel in FIG. 2.

Hereinafter, referring to FIGS. 2 to 3, a structure of a light emitting display device according to a first aspect of the present disclosure will be explained. FIG. 2 is an enlarged plan view illustrating a structure in which four pixels are arranged in a light emitting display device according to a first aspect of the present disclosure. FIG. 3 is an enlarged plan view illustrating a structure of one pixel in FIG. 2.

Referring to FIGS. 2 and 3, a light emitting display device according to the first aspect may have a repeating pattern of four pixels. For example, four pixels P1, P2, P3 and P4 arranged in a 2×2 matrix may form one unit for the repeating pattern. Each of the pixels P1, P2, P3 and P4 may have a quadrangular shape. The shape of a pixel is not limited to a quadrangular shape, but for convenience of description, the following explanation will use a quadrangular shape.

A first pixel P1 may be disposed at the first row and first column, a second pixel P2 may be disposed at the first row and second column, a third pixel P3 may be disposed at the second row and first column, and the fourth pixel P4 may be disposed at the second row and second column. One driving power line VDD may be disposed between the first pixel P1 and the second pixel P2, and between the third pixel P3 and the fourth pixel P4. One common power line AX may be disposed at the left side of the first and third pixels P1 and P3, and at the right sides of the second and fourth pixels P2 and P4, respectively.

In a repeating pattern unit composed of a 2×2 matrix, a connection part 700 connecting a cathode electrode and an auxiliary line is disposed at four corners, respectively. For example, the connection part 700 is disposed at the upper left corner of the first pixel, the upper right corner of the second pixel, the lower left corner of the third pixel, and the lower right corner of the fourth pixel, respectively.

In addition, in a repeating pattern unit composed of a 2×2 matrix, a dummy area 720 may be disposed at an intersection at the center. For example, the dummy area 720 may be disposed at a crossing point (or vertex) where the first pixel P1, the second pixel P2, the third pixel P3 and the fourth pixel P4 intersect each other. The dummy area 720 refers to an area without elements for connection or repair, unlike the connection part 700 or the repair part 710. Therefore, the dummy area 720 has only the driving power line VDD. In the present disclosure, such an arrangement manner is regarded as one pattern and has a structure in which this pattern is repeated over the whole area of the display panel.

Further, since the first pixel P1 and the second pixel P2 are disposed at the same row, the same first scan line SL1 and the same first auxiliary scan line SL1*a* are allocated. The first scan line SL1 and the first auxiliary scan line SL1*a* are connected to each other. For example, the first scan line SL1 and the first auxiliary scan line SL1*a* are connected by a first connection scan line SLB1.

The first connection scan line SLB1 for connecting the first scan line SL1 and the first auxiliary scan line SL1*a* corresponds to a repair part 710 for cutting the connectivity when an electrical problem occurs in either the first scan line SL1 or the first auxiliary scan line SL1*a*. The repair part 710 may be formed in a portion where the driving power line VDD or the common power line AX is disposed. When a problem occurs in the first scan line SL1 or the first auxiliary scan line SL1*a*, to facilitate cutting the connectivity, an opening OA is formed at the driving power line VDD or the common power line AX so that the repair part 710 may be exposed through the opening OA of the driving power line VDD or the common power line AX.

Since the third pixel P3 and the fourth pixel P4 are disposed in the same row, the second scan line SL2 and the second auxiliary scan line SL2*a* are allocated. The second scan line SL2 and the second auxiliary scan line SL2*a* are connected to each other. For example, the second scan line SL2 and the second auxiliary scan line SL2*a* are connected by a second connection scan line SLB2.

In the four pixels P1, P2, P3 and P4 arranged in a 2×2 matrix unit, the repair part 710 is located at the upper right corner of the first pixel P1, the lower right corner of the second pixel P2, the upper left corner of the third pixel P3, and the lower left corner of the fourth pixel P4, respectively.

Figure 4:
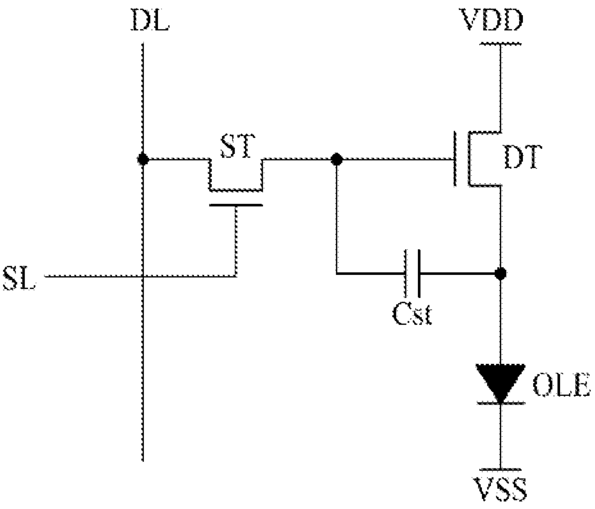
FIG. 4 is an equivalent circuit diagram illustrating a structure of one sub-pixel for the light emitting display device shown in FIG. 3.

Hereinafter, referring to FIGS. 4 to 8, detailed structure of the display device according to the first aspect of the present disclosure will be explained. Firstly, referring to FIG. 4, a schematic pixel structure will be described. FIG. 4 is an equivalent circuit diagram illustrating a structure of one sub-pixel for the light emitting display device shown in FIG. 3.

Referring to FIGS. 3 and 4, one pixel P1 of the light emitting display device according to the first aspect of the present disclosure may include three sub-pixels SP1, SP2 and SP3. It is not limited thereto. One pixel P1 may include four sub-pixels. Here, for convenience of description, a case in which three sub-pixels SP1, SP2 and SP3 are provided will be explained.

A first sub-pixel SP1 may be defined by a first scan line SL1, a first auxiliary scan line SL1*a*, a first data line DL1, a driving power line VDD and a common power line AX. Within the first sub-pixel SP1 of the light emitting display device, a switching thin film transistor ST, a driving thin film transistor SD, a light emitting diode OLE and a storage capacitance Cst are disposed. A high potential voltage for driving the light emitting diode OLE may be applied to the driving power line VDD.

For example, the switching thin film transistor ST may be connected to the first scan line SL1 and the first data line DL1. The switching thin film transistor ST may include a gate electrode SG, a semiconductor layer SA, a source electrode SS and a drain electrode SD. The gate electrode SG may be a portion of the first scan line SL1. The semiconductor layer SA may be crossing over the first scan line SL1 to overlap with the gate electrode SG. The region where the semiconductor layer SA and the gate electrode SG with each other may be defined as a channel region (or channel layer). The source electrode SS may be branched from the first data line DL1 and is connected to one side of the semiconductor layer SA. The drain electrode SD may be connected to the other side of the semiconductor layer SA and is connected to driving thin film transistor DT. The switching thin film transistor ST plays a role of selecting a pixel to be driven by applying a data signal to the driving thin film transistor DT.

The driving thin film transistor DT plays role of driving the light emitting diode OLE of the pixel selected by the switching thin film transistor ST. The driving thin film transistor DT may include a gate electrode DG, a semiconductor layer DA, a source electrode DS and a drain electrode DD. The gate electrode DG may be connected to the drain electrode SD of the switching thin film transistor ST. For example, the gate electrode DG of the driving thin film transistor DT may have a structure extending from the drain electrode SD of the switching thin film transistor ST. The semiconductor layer DA of the driving thin film transistor DT may be disposed to cross the gate electrode DG. The region where the semiconductor layer DA and the gate electrode DG overlap with each other may be defined as a channel region (or channel layer).

The semiconductor layer DA of the driving thin film transistor DT may include the drain electrode DD and the source electrode DS. For example, in the semiconductor layer DA, one side region of the channel region may be defined as the drain electrode DD, and the other side region of the channel region may be defined as the source electrode DS. The drain electrode DD may be connected to a horizontal driving power line VDDh. The horizontal driving power line VDDh may be branched to a horizontal direction (or X-axis direction) from a driving power line VDD running in a vertical direction (or Y-axis direction). The source electrode DS may be connected to the anode electrode ANO of the light emitting diode OLE (or light emitting element). A capacitor Cst may be formed between the gate electrode DG of the driving thin film transistor DT (or the drain electrode SD of the switching thin film transistor ST) and the anode electrode ANO of the light emitting diode OLE.

The driving thin film transistor DT may be disposed between the horizontal driving power line VDDh and the light emitting diode OLE. The driving thin film transistor DT controls the amount of the electric current flowing form the driving power line VDD to the light emitting diode OLE according to the voltage difference between the gate electrode DG and the source electrode DS.

The light emitting diode OLE may include an anode electrode ANO, an emission layer EL and a cathode electrode CAT. The light emitting diode OLE may emit light according to the current controlled by the driving thin film transistor DT. In other words, the light emitting diode OLE may provide the image data by emitting light according to the current controlled by the driving thin film transistor DT. The anode electrode ANO of the light emitting diode OLE may be connected to the source electrode DS of the driving thin film transistor DT, and the cathode electrode CAT is connected to the common power line AX. The common power line AX is connected to the low-power line VSS as shown in FIG. 1. Therefore, the cathode electrode CAT is electrically connected to the low-power line VSS through the common power line AX. Accordingly, the light emitting diode OLE may be driven by the current flowing from the high-potential line VDM to the low-power line VSS by the driving thin film transistor.

Each of the three sub-pixels SP1, SP2 and SP3 may be allocated to a red pixel R, a green pixel G and a blue pixel B disposed in the horizontal direction. The red pixel R, the green pixel G and the blue pixel B may form the first pixel P1. Even though it is not shown in the drawings, as another example, a red pixel, a green pixel, a white pixel and a blue pixel may be continuously arranged in a horizontal direction. The red pixel, the green pixel, the white pixel and the blue pixel may form one pixel.

Figure 5:
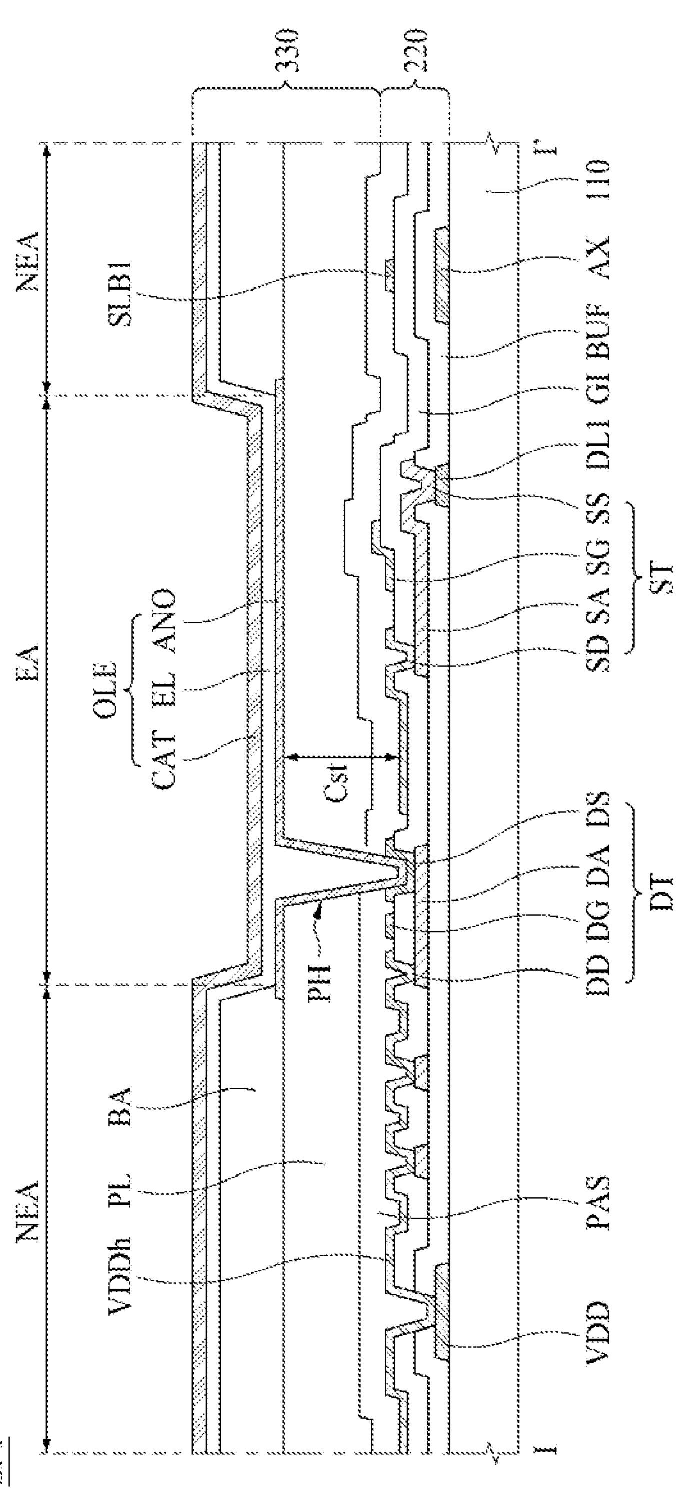
FIG. 5 is a cross-sectional view along cutting line I-I' in FIG. 3, for illustrating a structure of one sub-pixel in the light emitting display device according to a first aspect of the present disclosure.

Referring to FIG. 5, a cross sectional structure of the light emitting display according to the first aspect of the present disclosure will be explained. FIG. 5 is a cross-sectional view along to cutting line I-I' in FIG. 3, for illustrating a structure of one sub-pixel in the light emitting display device according to a first aspect of the present disclosure. The light emitting display device may include a substrate 110, a driving element layer 220 and a light emitting element layer 330. The driving element layer 220 may include multilayer thin films formed on the substrate 110. The driving element layer 220 may include the switching thin film transistor ST and a driving thin film transistor DT.

In detail, the first data line DL1 and the driving power line VDD are stacked on the substrate 110. Even though it is not shown, a light shielding layer disposed to overlap with the semiconductor layers SA and DA may be further included in addition to the first date line DL1 and the driving power line VDD. The light shielding layer may be disposed in an island shape spaced apart from the first data line DL1 and the driving power line VDD by a predetermined distance and overlapping with the semiconductor layers SA and DA.

A buffer layer BUF is stacked on the first data line DL1 and the driving power line VDD to cover the entire surface of the substrate 110. The switching thin film transistor ST and the driving thin film transistor DT are formed on the buffer layer BUF.

The semiconductor layer SA of the switching thin film transistor ST and the semiconductor layer DA of the driving thin film transistor DT are formed on the buffer layer BUF. When the light shielding layer is provided, the channel regions of the semiconductor layers SA and DA may overlap with the light shielding layer.

A gate insulating layer GI is stacked on the substrate 110 having the semiconductor layers SA and DA. On the gate insulating layer GI, the gate electrode SG is formed as overlapping with the channel region of the semiconductor layer SA of the switching thin film transistor ST, and the gate electrode DG is formed as overlapping with the channel region of the semiconductor layer DA of the driving thin film transistor DT.

Both side regions extending to both sides of a channel region overlapping with the gate electrode SG in the semiconductor layer SA of the switching thin film transistor ST may be defined as a source region and a drain region, respectively. The source region of the semiconductor layer SA may be used as a source electrode SS, and the source electrode SS is connected to the first data line DL1. The drain region of the semiconductor layer SA may be connected to the drain electrode SD. The drain electrode SD may be formed of the same material on the same layer as the gate electrode SG.

Similarly, both side regions extending to both sides of the channel region overlapping with the gate electrode DG in the semiconductor layer DA of the driving thin film transistor DT may be defined as a source region and a drain region, respectively. A source electrode DS contacting one side of the semiconductor layer DA and a drain electrode DD contacting the other side of the driving semiconductor layer DA are formed on the gate insulating layer GI while being spaced apart from the gate electrode DG. The drain region of the semiconductor layer DA may be contacted to the drain electrode DD. The source region of the semiconductor layer DA may be contacted to the source electrode DS. The drain electrode DD and the source electrode DS may be formed of the same material as the gate electrode DG.

The drain electrode DD of the driving thin film transistor DT is connected to the horizontal driving power line VDDh. For example, the drain electrode DD may be branched from the horizontal driving power lien VDDh. The horizontal driving power line VDDh may be contacted to the driving power line VDD via a contact hole.

The gate electrodes SG and DG, the source-drain electrodes SD, DS and DD and the horizontal driving power line VDDh are formed on the same layer, but are spatially or electrically separated from each other. Further, the source electrode SS of the switching thin film transistor ST is connected to the first data line DL1 through a contact hole penetrating the buffer layer BUF. Meanwhile, the drain electrode DD of the driving thin film transistor DT has a branched/extended structure from the horizontal driving power line VDDh. The horizontal driving power line VDDh is contacted to the driving power line VDD through a contact hole penetrating the gate insulating layer GI.

A passivation layer PAS is stacked on the substrate 110 on which the thin film transistors ST and DT are formed. The passivation layer PAS may be formed of an inorganic material such as silicon oxide or silicon nitride.

A light emitting element layer 330 is formed on the driving element layer 220. The light emitting element layer 330 may include a light emitting diode OLE. Before forming the light emitting diode OLE, a planarization layer PL may be stacked on the passivation layer PAS. The surface of the substrate 110 on which the thin film transistors ST and DT are formed have ununiformed condition, so the planarization layer PL may be a layer for flattening the surface condition. To make the height difference uniform, the planarization layer PL may be made of an organic material. The passivation layer PAS and the planarization layer PL may have a pixel contact hole PH for exposing a part of the source electrode DS of the driving thin film transistor DT.

An anode electrode ANO is formed on the upper surface of the planarization layer PL. The anode electrode ANO may be connected to the source electrode DS of the driving thin film transistor DT via the pixel contact hole PH. The anode electrode ANO may have different structure depending on the light emission type of the light emitting diode OLE. For example, in the case of a bottom emission type that provides light in the direction of the substrate 110, the anode electrode ANO may be made of a transparent conductive material. For another example, in the case of a top emission type that provides light in an upward direction facing the substrate 110, the anode electrode ANO may be made of a metal material having excellent light reflectance. Since the present disclosure relates to the top emission type, the anode electrode ANO may include a metal material.

A bank BA is formed on the surface of the substrate 110 on which the anode electrode ANO is disposed. The bank BA may be an insulating layer made of an inorganic material such as silicon oxide or silicon nitride. The bank BA covers the edge of the anode electrode ANO and exposes most of the central area. The central area not covered by the bank BA may be defined as an emission area EA, and an area in which the bank BA is formed may be defined as a non-emission area NEA.

An emission layer EL is deposited on the anode electrode ANO and the bank BA. The emission layer EL may be deposited on the entire of the display area AA as covering the anode electrode ANO and the bank BA. The emission layer EL according to an example may include two or more light emitting units to emit white light. For an example, the emission layer EL may include a first light emitting part providing a first light and a second light emitting part providing a second light which are vertically stacked to emit white light by mixing the first light and the second light.

For another example, the emission layer EL may include any one of a blue light emitting part, a green light emitting part and a red light emitting part for proving light corresponding to a color set in a pixel. In addition, the light emitting diode OLE may include a functional layer for improving light emitting efficiency and/or lifetime of the emission layer EL.

A cathode electrode CAT is deposited on the entire surface of the substrate 110 on which the emission layer EL is disposed. The cathode electrode CAT is stacked to make surface contact with the emission layer EL. The cathode electrode CAT may be formed over the entire substrate 110 to be commonly connected to the emission layer EL formed in all pixels. For the top emission type, the cathode electrode CAT may include a transparent conductive material. For example, the cathode electrode CAT may be made of a transparent conductive material such as indium-tin-oxide (ITO) and indium-zinc-oxide (IZO).

Figure 6:
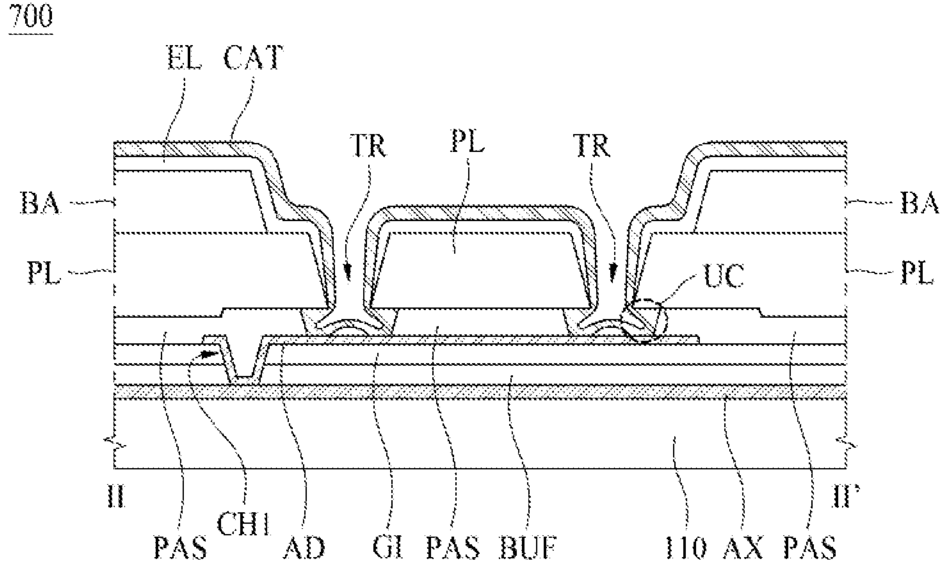
FIG. 6 is a cross-sectional view along to cutting line II-II' in FIG. 3, for illustrating a structure of a connection part between a common electrode and an auxiliary line in the light emitting display device according to the first aspect of the present disclosure.

Hereinafter, referring to FIG. 6, a structure in which the cathode electrode CAT and the common power line AX are connected in the light emitting display device according to the first aspect will be described. The cross-sectional structure of the connection part 700 will be described referring to FIG. 6. FIG. 6 is a cross-sectional view along to cutting line II-II' in FIG. 3, for illustrating a structure of a connection part between a common electrode and an auxiliary line in the light emitting display device according to the first aspect of the present disclosure.

The common power line AX is disposed on the substrate 110. The common power line AX may be made of the same material on the same layer as the low-potential line VSS. As shown in FIG. 1, the common power line AX may be connected to, or branched from, the low-potential line VSS outside the upper and lower sides of the display area AA.

The buffer layer BUF and the gate insulating layer GI are sequentially deposited on the common power line AX. An auxiliary electrode AD made of a gate material is formed on the gate insulating layer GI. The auxiliary electrode AD may be made of the same material on the same layer as the gate electrodes SG and DG shown in FIG. 5. The common power line AX is connected and contacted to the common power line AX through the first contact hole CH1 penetrating the buffer layer BUF and the gate insulating layer GI.

The passivation layer PAS is deposited on the auxiliary electrode AD. The planarization layer PL is deposited on the passivation layer PAS. By patterning the planarization layer PL, a closed curve-shape trench TR is formed. A portion of the passivation layer PAS may be exposed through the closed curve-shape trench TR. After that, the exposed portion of the passivation layer PAS is selectively etched. At this time, an etchant capable of selectively etching only the passivation layer PAS without etching the planarization layer PL may be used. As a result, the passivation layer PAS exposed by the trench TR under the planarization layer PL is over-etched to form an under-cut region exposing a portion of the auxiliary electrode AD.

After that, the anode electrode ANO is formed on the planarization layer PL on which the undercut UC is formed. As shown in FIG. 5, the anode electrode ANO is formed in the sub-pixel SP1 area. The anode electrode ANO is not formed in the undercut UC region. The bank BA defining the emission area EA for the anode electrode ANO is formed. Since the bank BA is formed in all areas where the anode electrode ANO is not present, the bank BA may be stacked even in the undercut UC area. By patterning the bank BA, a portion where the undercut UC is formed in the connection part 700 is exposed. The emission layer EL is deposited on the bank BA. The emission layer EL is deposited on the upper surface of the bank BA and the exposed planarization layer PL. Here, in the area where the trench TR and the undercut UC are formed, the emission layer EL is deposited only on the portion of the auxiliary electrode AD exposed by the trench TR, but the emission layer EL is not deposited on the auxiliary electrode AD exposed at the portion where the undercut UC is formed.

The cathode electrode CAT is deposited on the emission layer EL. The cathode electrode CAT is stacked according to the cross-sectional profile shape of the undercut UC region. Accordingly, the cathode electrode CAT is deposited on the exposed auxiliary electrode AD in the undercut UC area, and also on the sidewall and the upper side constituting the undercut UC area. As the result, the cathode electrode CAT is contacted and connected to the auxiliary electrode AD. The auxiliary electrode AD is connected to the common power line AX, and the common power line AX is connected to the low-potential line VSS. Therefore, the cathode electrode CAT has a structure connected to the low-potential line VSS through the connection part 700 which are evenly distributed over the entire area of the display panel.

One connection part 700 is allocated for each 2×2 matrix unit. In the top emission type large area light emitting display panel, one connection part 700 is disposed for every 4 pixels. Accordingly, the sheet resistance of the cathode electrode CAT may be kept low while minimizing and optimizing the number of the connection parts 700. As a result, the low-potential state of the cathode electrode CAT may be constantly maintained while minimizing the ratio of the area occupied by the connection part 700 to the total area of the display area AA.

Figure 7:
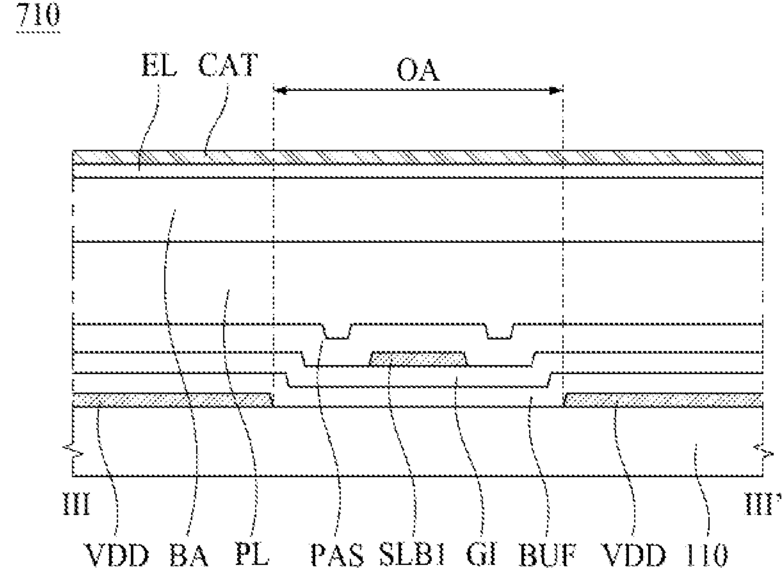
FIG. 7 is a cross-sectional view along to cutting line III-III' in FIG. 3, for illustrating a structure of a repair part in the light emitting display device according to the first aspect of the present disclosure.

Hereinafter, referring to FIG. 7, a cross-sectional structure of the repair part 710 in the light emitting display device according to the first aspect of the present disclosure will be explained. FIG. 7 is a cross-sectional view along to cutting line III-III' in FIG. 3, for illustrating a structure of a repair part in the light emitting display device according to the first aspect of the present disclosure. The driving power line VDD is formed on the substrate 110. The driving power line VDD may have a narrow lane shape having a predetermined width. Meanwhile, in the repair part 710, an opening OA is formed by removing the central portion of the driving power line VDD. Referring to FIG. 3, the repair part 710 is disposed not only at a portion of the driving power line VDD but also on a portion of the common power line AX. Hereinafter, for convenience, a portion disposed on a part of the driving power line VDD will be described.

The buffer layer BUF and the gate insulating layer GI are sequentially deposited on the driving power line VDD. The first connecting scan line SLB1 is formed on the gate insulating layer GI. The first connecting scan line SLB1 may be an element connecting the first scan line SL1 and the first auxiliary scan line SL2.

The passivation layer PAS is deposited on the first connecting scan line SLB1. The planarization layer PL is deposited on the passivation layer PAS. The light emitting layer EL and the cathode electrode CAT are sequentially deposited on the bank BA.

The first connecting scan line SLB1 may have a structure exposing in the direction of the substrate 110 through the openings OA formed in the driving power line VDD. Therefore, when it is necessary to disconnect the first connecting scan line SLB1, the first connecting scan line SLB1 may be disconnected by radiating a laser from under the substrate 110 through the openings OA.

In FIG. 7, for convenience, a cross-sectional structure of the repair part 710 disposed on the common power line AX in FIG. 3. is illustrated and explained. However, according to FIG. 3, one more repair part 710 is also disposed on the driving power line VDD.

Figure 8:
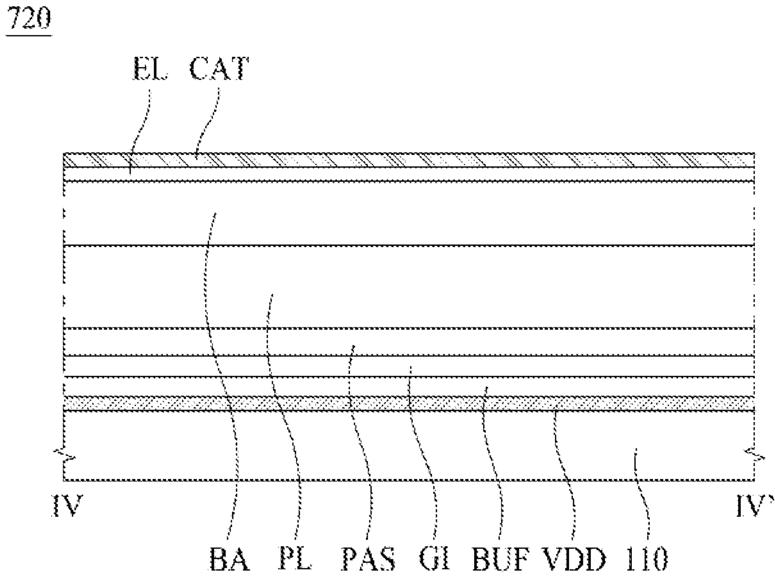
FIG. 8 is a cross-sectional view along to cutting line IV-IV' in FIG. 3, for illustrating a structure of a dummy area in the light emitting display device according to the first aspect of the present disclosure.

Hereinafter, referring to FIG. 8, a structure of the dummy area 720 in the light emitting display according to the first aspect of the present disclosure. FIG. 8 is a cross-sectional view along to cutting line IV-IV' in FIG. 3, for illustrating a structure of a dummy area in the light emitting display device according to the first aspect of the present disclosure. Unlike the connection part 700 or the repair part 710, the dummy area 720 means an area that does not have a structure for connection or disconnection.

The driving power line VDD is formed on the substrate 110 in the dummy area 720. Even though it is not shown in figures, the dummy area 720 may also be disposed on a part of the common power line AX. Here, for convenience of description, a case of being disposed on the driving line VDD will be explained. The buffer layer BUF, the gate insulating layer GI and the passivation layer PAS are sequentially deposited on the driving power line VDD. The planarization layer PL and the bank BA are sequentially deposited on the passivation layer PAS. The emission layer EL and the cathode electrode CAT are sequentially deposited on the bank BA.

In such a structure, one connection part 700 connecting the cathode electrode CAT and the auxiliary electrode AD is disposed for each 2×2 pixel unit. Accordingly, other components such as the repair part 710 may be disposed at the other corner where the connection part 700 is not disposed, compared to the case where the connection part 700 is disposed at each of the four corners of the each pixel. As a result, a larger ratio of the emission area EA in the display area AA of the display panel may be ensured. In addition, the resistance of the cathode electrode CAT may be maintained at a low level even when one is arranged for each 2×2 pixel unit. So that the low-potential voltage transmitted through the auxiliary electrode AD may be constantly supplied to the cathode electrode CAT. Consequently, the display quality of the display panel may be stabilized.

Figure 9:
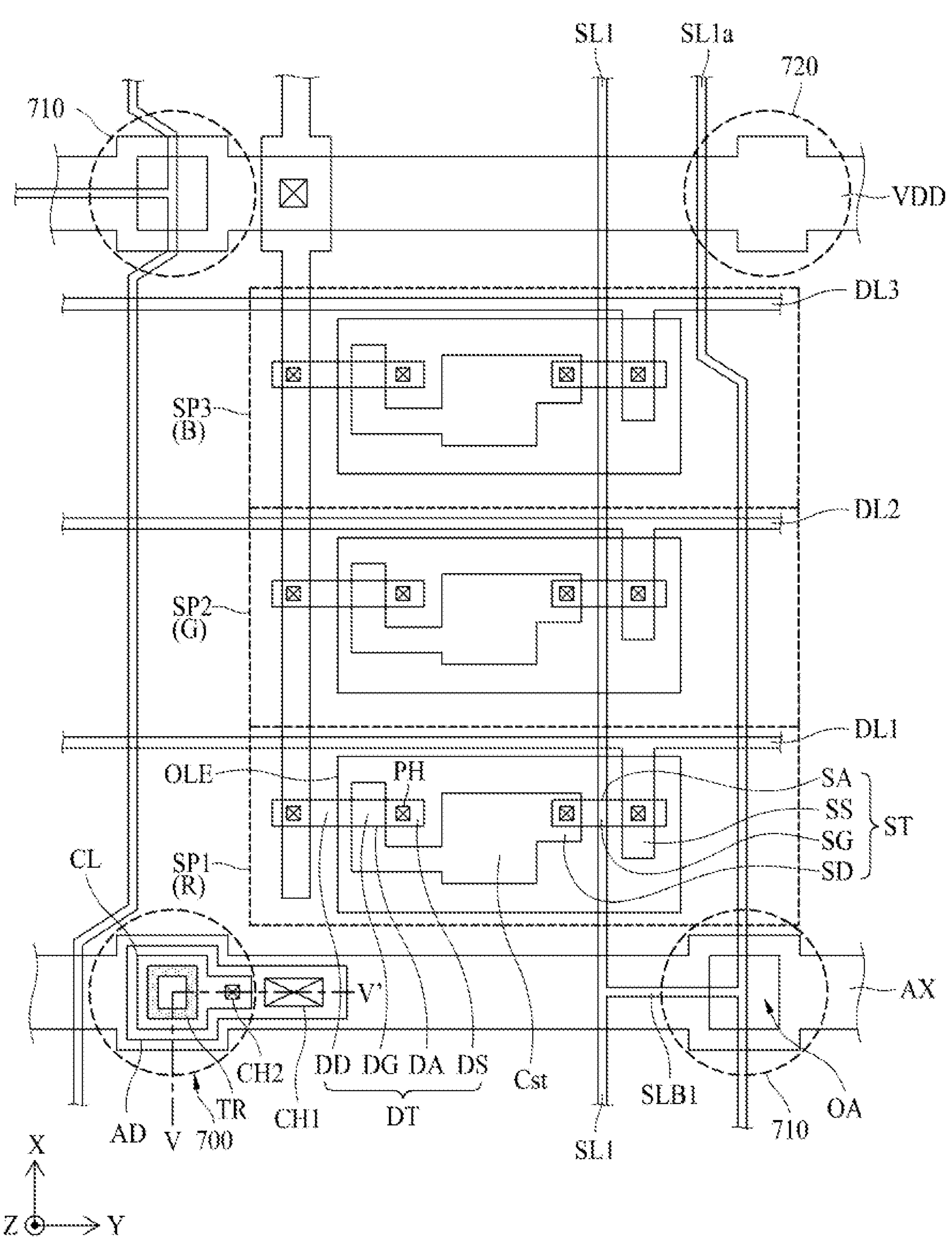
FIG. 9 is an enlarged plan view illustrating a structure of one pixel according a second aspect of the present disclosure.
Figure 10:
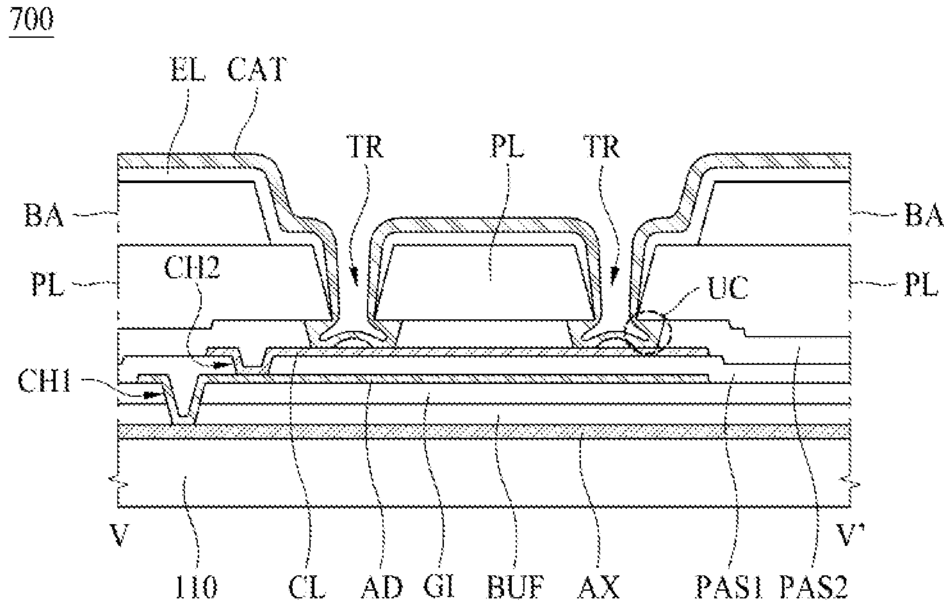
FIG. 10 is a cross-sectional view along to cutting line V-V' in FIG. 9, for illustrating a structure of a connection part between a common electrode and an auxiliary line in the light emitting display device according to the second aspect of the present disclosure.

Hereinafter, referring to FIGS. 9 and 10, a structure of a light emitting display device according a second aspect of the present disclosure will be explained. FIG. 9 is an enlarged plan view illustrating a structure of one pixel according a second aspect of the present disclosure. FIG. 10 is a cross-sectional view along to cutting line V-V' in FIG. 9, for illustrating a structure of a connection part between a common electrode and an auxiliary line in the light emitting display device according to the second aspect of the present disclosure.

Compared to the first aspect, the second aspect of the present disclosure has a difference in the structure of the connection part 700 and no difference in other elements. Therefore, the structural features of the connection part 700 will be mainly described, and other elements refer to the case of the first aspect.

Firstly, referring to FIG. 9, an auxiliary electrode AD and a protective electrode CL are formed in the connection part 700 to overlap with the common power line AX. The protective electrode CL is formed inside area of the auxiliary electrode AD. A trench TR is formed inside area of the protective electrode CL.

A first contact hole CH1 is formed at the auxiliary electrode AD. The auxiliary electrode AD is connected to the common power line AX through the first contact hole CH1. A second contact hole CH2 is formed at the protective electrode CL. The protective electrode CL is connected to the auxiliary electrode AD through the second contact hole CH2.

Hereinafter, referring to FIG. 10, a structure in which the cathode electrode CAT and the common power line AX are connected in the light emitting display device according to the second aspect of the present disclosure will be explained. Referring to FIG. 10, a cross-sectional structure of the connection part 700 will be described.

A common power line AX is disposed on the substrate 110. The common power line AX may be made of the same material on the same layer as the low-potential line VSS. As shown in FIG. 1, the common power line AX may be connected to the low-potential line VSS outside the upper and lower sides of the display area AA, or may be branched from the low-potential line VSS.

A buffer layer BUF and a gate insulating layer GI are sequentially deposited on the common power line AX. An auxiliary electrode AD made of the gate material is formed on the gate insulating layer GI. The auxiliary electrode AD may be made of the same material on the same layer as the gate electrodes SG and DG, as shown in FIG. 5. The auxiliary electrode AD is connected to the common power line AX through a first contact hole CH1 penetrating the buffer layer BUF and the gate insulating layer GI.

A first passivation layer PAS1 is deposited on the auxiliary electrode AD. A protective electrode CL is formed on the first passivation layer PAS1. The protective electrode CL may be made of a metal material having excellent corrosion resistance. For example, the protective electrode CL may be made of molybdenum (Mo), titanium (Ti), chromium (Cr), nickel (Ni) or an alloy thereof.

For example, in the same structure as the first aspect, the gate electrode SG and DG may have a structure in which molybdenum-titanium alloy (MoTi) and copper (Cu) may be sequentially stacked, so copper (Cu) disposed at the upper layer. In this case, when the auxiliary electrode AD having the same material as the gate electrodes SG and DG is exposed through the trench TR, the exposed copper Cu may be oxidized or damaged. When the auxiliary electrode AD for keeping the resistance of the cathode electrode CAT low is damaged, the connectivity is deteriorated and it is difficult to keep the resistance of the cathode electrode CAT low.

In the second aspect, a protective electrode CL is further provided to prevent damage to the auxiliary electrode AD, when the auxiliary electrode AD has the same material as the gate electrodes SG and DG including an easily oxidized material. The protective electrode CL may be connected to the auxiliary electrode AD through the second contact hole CH2 penetrating the first passivation layer PAS1.

A second passivation layer PAS2 covering the entire surface of the substrate 110 is deposited on the protective electrode CL. A planarization layer PL is deposited on the second passivation layer PAS2. The planarization layer PL is patterned to form a trench TR having a closed curve shape. A portion of the second passivation layer PAS2 is exposed through the closed curve-shaped trench TR. The exposed second passivation layer PAS2 is selectively etched. At this time, an etchant capable of selectively etching only the second passivation layer PAS2 without etching the planarization layer PL may be used. Consequently, the second passivation layer PAS2 exposed by the trench TR under the planarization layer PL is over-etched to form an undercut UC region exposing a portion of the protective electrode CL.

An anode electrode ANO is formed on the planarization layer PL on which the undercut CU is formed. As shown in FIG. 5, the anode electrode ANO is formed in the sub-pixel SP1 area. Therefore, the anode electrode ANO is not formed in the undercut UC region. A bank BA defining the emission area EA is formed on the anode electrode ANO. Since the bank BA is formed in all areas where the anode electrode ANO is not disposed, the bank BA may be disposed even in the undercut CU region. By patterning the bank BA, a portion where the undercut UC is formed in the connection part 700 is exposed. An emission layer EL is deposited on the bank BA. The emission layer EL is deposited on the upper surfaces of the bank BA and the exposed planarization layer PL. At this time, in the portion where the trench TR and the undercut CU are formed, the emission layer EL is deposited only on the portion of the protective electrode CL exposed by the trench TR. The emission layer EL is not deposited on the protective electrode CL exposed at the portion where the undercut UC is formed.

A cathode electrode CAT is deposited on the emission layer EL. The cathode electrode CAT is deposited along the cross-sectional profile of the undercut UC region. Accordingly, the cathode electrode CAT is deposited on the exposed protective electrode CL in the undercut UC region, and also on the side wall and the upper side constituting the undercut UC. Thus, the cathode electrode CAT is connected to the protective electrode CL. The protective electrode CL is connected to the auxiliary electrode AD, and the auxiliary electrode AD is connected to the common power line AX. In addition, since the common power line AX is connected to the low-potential line VSS, the cathode electrode CAT has a structure connected to the low-potential line VSS through the connection part 700 evenly distributed over the entire area of the display panel.

One connection part 700 is allocated for each 2×2 matrix unit. In the top emission type large area display panel, one connection part 700 is disposed for every 4 pixels. Accordingly, sheet resistance of the cathode electrode CAT may be kept low while minimizing and optimizing the number of connection parts 700. As a result, the low-potential condition of the cathode electrode CAT may be constantly maintained while minimizing the ratio of the area occupied by the connection part 700 to the total area of the display area AA.

The features, structures, effects and so on described in the above example aspects of the present disclosure are included in at least one example aspect of the present disclosure, and are not necessarily limited to only one example aspect. Furthermore, the features, structures, effects and the like explained in at least one example aspect may be implemented in combination or modification with respect to other example aspects by those skilled in the art to which this disclosure is directed. Accordingly, such combinations and variations should be construed as being included in the scope of the present disclosure.

It will be apparent to those skilled in the art that various substitutions, modifications, and variations are possible within the scope of the present disclosure without departing from the spirit and scope of the present disclosure. Therefore, it is intended that aspects of the present disclosure cover the various substitutions, modifications, and variations of the present disclosure, provided they come within the scope of the appended claims and their equivalents. These and other changes may be made to the aspects in light of the above detailed description. In general, in the following claims, the terms used should not be construed to limit the claims to the specific example aspects disclosed in the specification and the claims, but should be construed to include all possible aspects along with the full scope of equivalents to which such claims are entitled. Accordingly, the claims are not limited by the disclosure.

What is claimed is:

1. A light emitting display device comprising:

a common power line and a driving power line disposed in parallel each other on a substrate;

a first pixel disposed between the common power line and the driving power line, and including a left side, a right side, an upper side and a lower side;

a first connection part disposed at a first crossing area where the left side and the upper side intersect;

a first dummy area disposed at a second crossing area where the right side and the lower side intersect; and a common electrode disposed over an entire substrate as one layer, wherein the common power line is connected to the common electrode at the first connection part, and wherein the driving power line passes the first dummy area.

2. The light emitting display device according to claim 1, further comprising:

a first repair part disposed at a third crossing area where the left side and the lower side intersect and the common power line passes the first repair part; and a second repair part disposed at a fourth crossing area where the right side and the upper side intersect and the driving power line passes the second repair part.

3. The light emitting display device according to claim 2, wherein the first repair part including:

an open area disposed at a central portion of the common power line;

a buffer layer disposed on the common power line;

a scan line passing the open area on the buffer layer;

a passivation layer disposed on the scan line;

a planarization layer disposed on the passivation layer; and a bank disposed on the planarization layer.

4. The light emitting display device according to claim 2, wherein the second repair part including:

an open area disposed at a central portion of the driving power line;

a buffer layer disposed on the driving power line;

a scan line passing the open area on the buffer layer;

a passivation layer disposed on the scan line;

a planarization layer disposed on the passivation layer; and a bank disposed on the planarization layer.

5. The light emitting display device according to claim 1, further comprising:

a second pixel adjacent to the left side of the first pixel with the common power line interposed there-between;

a third repair part disposed at a fifth crossing area where a left side of the second pixel and an upper side of the second pixel intersect; and a second dummy area disposed at a sixth crossing area where the left side of the second pixel and a lower side of the second pixel.

6. The light emitting display device according to claim 1, further comprising:

a second pixel adjacent to the right side of the first pixel with the driving power line interposed there-between;

a second connection part disposed at a seventh crossing area where a right side of the second pixel and an upper side of the second pixel intersect; and a third repair part disposed at an eighth crossing area where the right side of the second pixel and a lower side of the second pixel.

7. The light emitting display device according to claim 1, wherein the first pixel includes at least three sub pixels, wherein one sub pixel includes:

a driving element disposed at each sub pixels;

a driving electrode connected to the driving element;

an emission layer disposed on the driving electrode; and the common electrode disposed on the emission layer.

8. The light emitting display device according to claim 7, wherein the first connection part includes:

the common power line disposed on the substrate;

a buffer layer disposed on the common power line;

an auxiliary electrode connected to the common power line and disposed on the buffer layer at the first crossing area;

a passivation layer disposed on the auxiliary electrode;

a circular trench exposing some of the auxiliary electrode and disposed at the passivation layer;

a planarization layer disposed on the passivation layer for exposing the trench;

a bank disposed on the planarization layer for exposing the bank; and an undercut area removing some of the planarization layer under the bank, wherein the emission layer is disposed on the bank and the planarization layer except the undercut area, and wherein the common electrode is connected to the auxiliary electrode exposed at the undercut area.

9. The light emitting display device according to claim 8, wherein the driving power line is disposed at the right side, and wherein, at the second crossing area, the buffer layer covering the driving power line, the passivation layer, the planarization layer, the bank, the emission layer and the common electrode are sequentially disposed.

10. A light emitting display device comprising:

a first pixel disposed at a first row and a first column of a 2×2 matrix unit on a substrate;

a second pixel disposed at the first row and a second column;

a third pixel disposed at a second row and the first column;

a fourth pixel disposed at the second row and the second column;

a common electrode deposited as one layer covering entire substrate including the first pixel, the second pixel, the third pixel and the fourth pixel;

a first common power line disposed at a left side of the first pixel and the third pixel;

a second common power line disposed at a right side of the second pixel and the fourth pixel;

connection parts disposed at a left upper corner of the first pixel, at a right upper corner of the second pixel, at a left lower corner of the third pixel and at a right lower corner of the fourth pixel; and a dummy area disposed at crossing area where the first to fourth pixels are commonly intersect, wherein the common electrode connects the first common power line and the second common power line at the connection parts.

11. The light emitting display device according to claim 10, further comprising a driving power line disposed between the first pixel and the second pixel, and between the third pixel and the fourth pixel.

12. The light emitting display device according to claim 11, further comprising repair parts disposed at a right upper corner of the first pixel, at a right lower corner of the second pixel, at a left upper corner of the third pixel, and at a left lower corner of the fourth pixel.

13. The light emitting display device according to claim 12, further comprising auxiliary electrodes disposed at the connection parts and connected to the first common power line and the second common power line, wherein the auxiliary electrodes are connected to the common electrode.

14. The light emitting display device according to claim 13, further comprising:

a first scan line disposed at a lower side of the first pixel and the second pixel;

a first auxiliary scan line disposed at a first predetermined distance from the first scan line;

a first connecting scan line disposed at the repair parts and connecting the first scan line to the first auxiliary scan line;

a second scan line disposed at a lower side of the third pixel and the fourth pixel;

a second auxiliary scan line disposed at a second predetermined distance from the second scan line; and a second connecting scan line disposed at the repair parts and connecting the second scan line to the second auxiliary scan line.

15. The light emitting display device according to claim 13, wherein each of the first to fourth pixels includes at least three sub pixels, wherein each of the sub pixels includes:

a driving element;

a driving electrode connected to the driving element; and an emission layer disposed on the driving electrode, and wherein the common electrode is disposed on the emission layer.

* * * * *